(12) United States Patent  
Sirigu et al.

(10) Patent No.: US 11,472,668 B2
(45) Date of Patent: Oct. 18, 2022

(54) ELEVATOR ALARM SYSTEMS (71) Applicant: Otis Elevator Company, Farmington, CT (US)

(72) Inventors: Gerard Sirigu, Gien (FR); Guillaume Trouvain, Gien (FR)

(73) Assignee: OTIS ELEVATOR COMPANY, Farmington, CT (US)

(*) Notice: Subject to any disclaimer, the term of this patent is extended or adjusted under 35 U.S.C. 154(b) by 451 days.

(21) Appl. No.: 16/674,579

(22) Filed: Nov. 5, 2019

(65) Prior Publication Data

US 2020/0148507 A1 May 14, 2020

(30) Foreign Application Priority Data

Nov. 14, 2018 (EP) .................................... 18290132

(51) Int. Cl.
*B66B 5/00* (2006.01)
*G06F 1/30* (2006.01)
(Continued)

(52) U.S. Cl.
CPC .......... *B66B 5/0031* (2013.01); *B66B 5/0025* (2013.01); *G01R 31/386* (2019.01);
(Continued)

(58) Field of Classification Search
CPC ..... B66B 5/0031; B66B 5/0018; B66B 5/027; H02J 9/06; H02J 9/061; H02J 7/0047; H02J 7/0048; H02J 7/005; G06F 1/30; G08B 21/182; G08B 21/185; G01R 31/382; G01R 31/386; G01R 31/392; G01R 31/387; G01R 31/388; H01M 10/48

See application file for complete search history.

(56) References Cited

U.S. PATENT DOCUMENTS 5,894,222 A * 4/1999 Hibino ................. G01R 31/386
324/427
6,998,995 B2 2/2006 Nakajima
(Continued)

FOREIGN PATENT DOCUMENTS

CN 201289678 Y 8/2009
CN 201494980 U 6/2010
(Continued)

OTHER PUBLICATIONS

European Search Report for European Application No. 18290132.2, International Filing Date Nov. 14, 2018, dated May 27, 2019, 10 pages.

*Primary Examiner* — Ryan Johnson
(74) *Attorney, Agent, or Firm* — Cantor Colburn LLP (57) ABSTRACT

Electrical systems of elevators and methods thereof, with an elevator alarm system configured to provide an alarm within an elevator car of the elevator system, wherein the elevator alarm system is configured to be supplied with power from a primary power source. A secondary power source includes a first storage device and a second storage device and a controller is configured to control a power flow from the secondary power source to the elevator alarm system when the primary power source fails and test a capacity of the first storage device by discharging a power of the first storage device and storing said discharged power within the second storage device.

20 Claims, 6 Drawing Sheets (51) Int. Cl.
  *H02J 9/06* (2006.01)
  *G01R 31/385* (2019.01)
  *G01R 31/387* (2019.01)
  *H01M 10/48* (2006.01)
  *G01R 31/392* (2019.01)

(52) U.S. Cl.
  CPC ......... *G01R 31/387* (2019.01); *G01R 31/392* (2019.01); *G06F 1/30* (2013.01); *H01M 10/48* (2013.01); *H02J 9/06* (2013.01)

(56) References Cited

U.S. PATENT DOCUMENTS

| | | | |
|---|---|---|---|
| 9,834,406 | B2 | 12/2017 | Mezzadri et al. |
| 2018/0237258 | A1 | 8/2018 | Herkel |

FOREIGN PATENT DOCUMENTS

| | | | |
|---|---|---|---|
| CN | 101521410 | B | 12/2010 |
| CN | 104030118 | A | 9/2014 |
| CN | 204689311 | U | 10/2015 |
| CN | 105228938 | A | 1/2016 |
| CN | 205070557 | U | 3/2016 |
| CN | 205407405 | U | 7/2016 |
| CN | 205753568 | U | 11/2016 |
| CN | 107500069 | A | 12/2017 |
| CN | 108455395 | A | 8/2018 |
| EP | 1749783 | A1 | 2/2007 |
| EP | 2226642 | A1 | 9/2010 |
| EP | 3156358 | A1 | 4/2017 |
| EP | 3288145 | A1 | 2/2018 |
| JP | 2004259658 | A * | 9/2004 |
| JP | 2014110692 | A * | 6/2014 |
| JP | 2018030701 | A | 3/2018 |
| WO | 2013179324 | A1 | 12/2013 |
| WO | 2017081113 | A1 | 5/2017 |

* cited by examiner

ELEVATOR ALARM SYSTEMS

CROSS REFERENCE TO RELATED APPLICATIONS

This application claims the benefit of European Application No. 18290132.2, filed Nov. 14, 2018, which is incorporated herein by reference in its entirety.

BACKGROUND

The subject matter disclosed herein generally relates to elevator systems and, more particularly, to power systems for elevator alarm systems.

Typical elevator systems include alarms to provide notification and/or contact between passengers using the elevator system and rescue personnel. Such systems using include a battery configured to provide backup power to the elevator alarm system, in the event that primary power (e.g., grid power) is lost. The battery provides sufficient power to operate the alarm during such power loss or power failure. In newer systems, minimum requirements may be implemented to ensure sufficient power is provided for a specific duration. For example, some requirements may be a guarantee for one hour of functionality of the elevator alarm system, including fifteen minutes of voice communication. One solution for such durations is to increase a battery capacity, but such solution may increase costs, volume/housing requirements, etc. Further, temperature, battery life, electrical tolerances, etc. can affect battery capacity. Accordingly, testing of such batteries may be required to ensure proper capacity to maintain power to an elevator alarm system during a power failure.

To test and ensure battery capacity, an enclosed chemical energy may be measured by discharging the battery. However, because of the nature of the testing (i.e., discharge), the battery power will be unavailable during the measurement and reload/recharge time. As such, the elevator system will be stopped during the time when the alarm function on battery back-up cannot be ensured. Further, because of the nature of this testing process, a mechanic is required on-site, and thus scheduling such testing can be difficult and testing may be performed too frequently or not frequently enough (e.g., some batteries may not require testing but are tested anyway, or some batteries may be reduced in capacity too much, and thus a period may have existed when the back-up battery was insufficient for its intended purpose). Thus, improved battery testing is desirable.

BRIEF SUMMARY

According to some embodiments, electrical systems for elevator systems are provided. The electrical systems include an elevator alarm system configured to provide an alarm within an elevator car of the elevator system, wherein the elevator alarm system is configured to be supplied with power from a primary power source, a secondary power source having a first storage device and a second storage device, and a controller. The controller is configured to control a power flow from the secondary power source to the elevator alarm system when the primary power source fails and test a capacity of the first storage device by discharging a power of the first storage device and storing said discharged power within the second storage device.

In addition to one or more of the features described above, or as an alternative, further embodiments may include that the test is performed to monitor a capacity level of the first storage device and compare such capacity to a predetermined value.

In addition to one or more of the features described above, or as an alternative, further embodiments may include that when the monitored capacity level of the first storage device is below the predetermined value, the controller is configured to generate a notification for maintenance.

In addition to one or more of the features described above, or as an alternative, further embodiments may include that the first storage device is a battery.

In addition to one or more of the features described above, or as an alternative, further embodiments may include that the second storage device is a capacitor.

In addition to one or more of the features described above, or as an alternative, further embodiments may include a cell balancing element operably connected to the capacitor.

In addition to one or more of the features described above, or as an alternative, further embodiments may include that the second storage device is a battery.

In addition to one or more of the features described above, or as an alternative, further embodiments may include that a first switch is located between the primary power source and the first storage device, a second switch is located between the first storage device and the second storage device, and a third switch is located between the third storage device and the elevator alarm system.

In addition to one or more of the features described above, or as an alternative, further embodiments may include that the controller is configured to control operation of the first switch, the second switch, and the third switch.

In addition to one or more of the features described above, or as an alternative, further embodiments may include a control system, the control system including the controller, a voltmeter, and an ammeter.

In addition to one or more of the features described above, or as an alternative, further embodiments may include a converter arranged between the second storage device and the elevator alarm system.

In addition to one or more of the features described above, or as an alternative, further embodiments may include that the converter is located between the second storage device and the first storage device.

In addition to one or more of the features described above, or as an alternative, further embodiments may include that the primary power source is grid power.

According to some embodiments, methods for testing a secondary power source of an elevator alarm system are provided. The secondary power source includes a first storage device and a second storage device. The method includes isolating the secondary power source, discharging a power from the first storage device to the second storage device, monitoring a current and a voltage of the discharged power, storing the discharged power in the second storage device, determining a charge of the first storage device based on the monitored current and voltage, comparing the determined charge against a predetermined value, and generating a notification when the determined charge is less than or equal to the predetermined value.

In addition to one or more of the features described above, or as an alternative, further embodiments of the methods may include detecting a power failure of a primary power source, connecting the secondary power source to the elevator alarm system, and supplying power from at least one of the first storage device and the second storage device to the elevator alarm system during the power failure.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The present disclosure is illustrated by way of example and not limited by the accompanying figures in which like reference numerals indicate similar elements.

DETAILED DESCRIPTION

Figure 1:
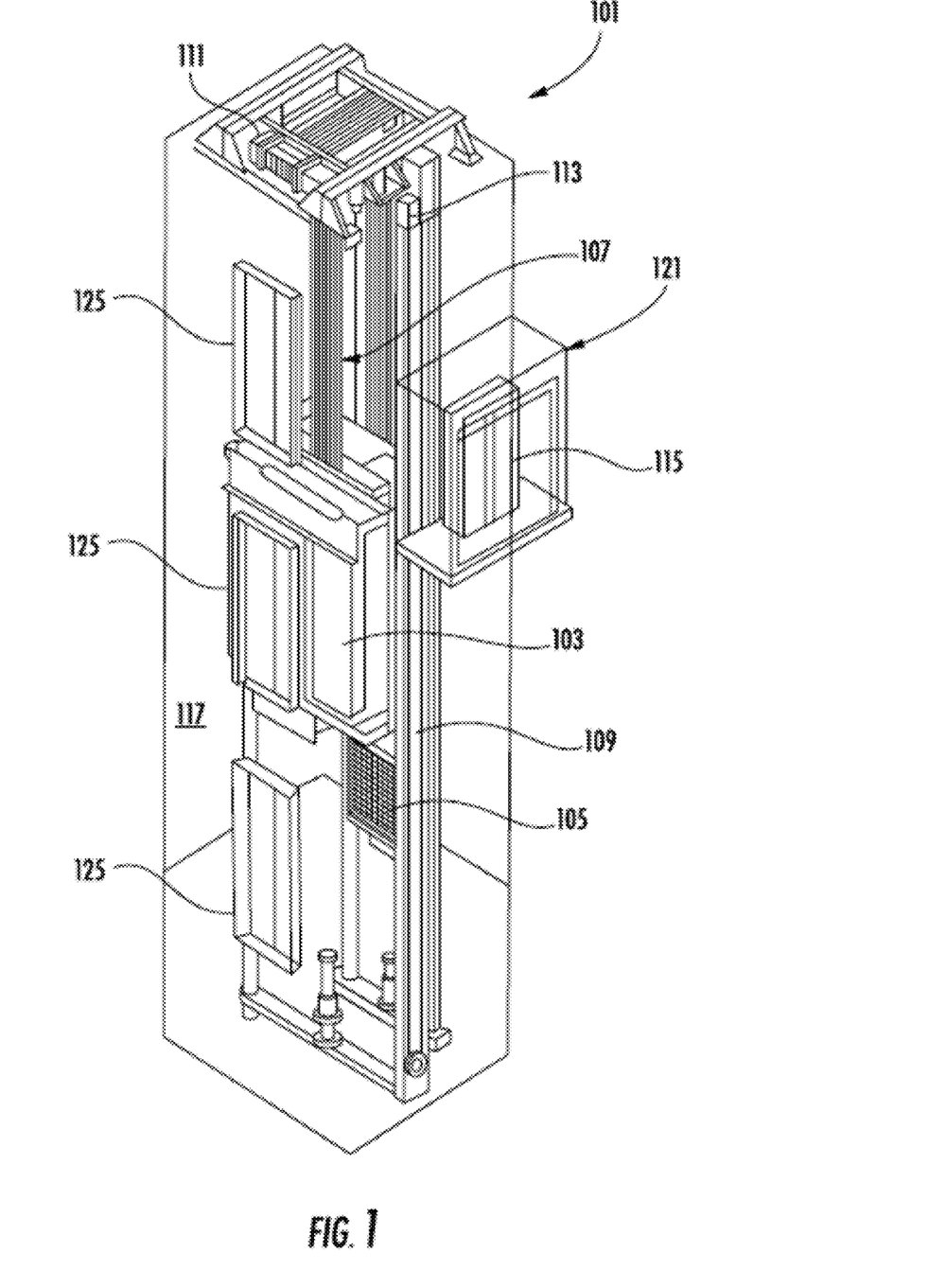
FIG. 1 is a schematic illustration of an elevator system that may employ various embodiments of the present disclosure.

FIG. 1 is a perspective view of an elevator system 101 including an elevator car 103, a counterweight 105, a tension member 107, a guide rail 109, a machine 111, a position reference system 113, and an elevator controller 115. The elevator car 103 and counterweight 105 are connected to each other by the tension member 107. The tension member 107 may include or be configured as, for example, ropes, steel cables, and/or coated-steel belts. The counterweight 105 is configured to balance a load of the elevator car 103 and passengers and is configured to facilitate movement of the elevator car 103 concurrently and in an opposite direction with respect to the counterweight 105 within an elevator shaft 117 and along the guide rail 109.

The tension member 107 engages the machine 111, which is part of an overhead structure of the elevator system 101. The machine 111 is configured to control movement between the elevator car 103 and the counterweight 105. The position reference system 113 may be mounted on a fixed part at the top of the elevator shaft 117, such as on a support or guide rail, and may be configured to provide position signals related to a position of the elevator car 103 within the elevator shaft 117. In other embodiments, the position reference system 113 may be directly mounted to a moving component of the machine 111, or may be located in other positions and/or configurations as known in the art. The position reference system 113 can be any device or mechanism for monitoring a position of an elevator car 103 and/or counterweight 105, as known in the art. For example, without limitation, the position reference system 113 can be an encoder, sensor, or other system and can include velocity sensing, absolute position sensing, etc., as will be appreciated by those of skill in the art.

The elevator controller 115 is located, as shown, in a controller room 121 of the elevator shaft 117 and is configured to control the operation of the elevator system 101, and particularly the elevator car 103. For example, the elevator controller 115 may provide drive signals to the machine 111 to control the acceleration, deceleration, leveling, stopping, etc. of the elevator car 103. The elevator controller 115 may also be configured to receive position signals from the position reference system 113 or any other desired position reference device. When moving up or down within the elevator shaft 117 along guide rail 109, the elevator car 103 may stop at one or more landings 125 as controlled by the elevator controller 115. Although shown in a controller room 121, those of skill in the art will appreciate that the elevator controller 115 can be located and/or configured in other locations or positions within the elevator system 101. In one embodiment, the elevator controller 115 may be located remotely or in the cloud.

The machine 111 may include a motor or similar driving mechanism. In accordance with embodiments of the disclosure, the machine 111 is configured to include an electrically driven motor. The power supply for the motor may be any power source, including a power grid, which, in combination with other components, is supplied to the motor. The machine 111 may include a traction sheave that imparts force to tension member 107 to move the elevator car 103 within elevator shaft 117.

Although shown and described with a roping system including tension member 107, elevator systems that employ other methods and mechanisms of moving an elevator car within an elevator shaft may employ embodiments of the present disclosure. For example, embodiments may be employed in ropeless elevator systems using a linear motor to impart motion to an elevator car. Embodiments may also be employed in ropeless elevator systems using a hydraulic lift to impart motion to an elevator car. FIG. 1 is merely a non-limiting example presented for illustrative and explanatory purposes.

Figure 2:
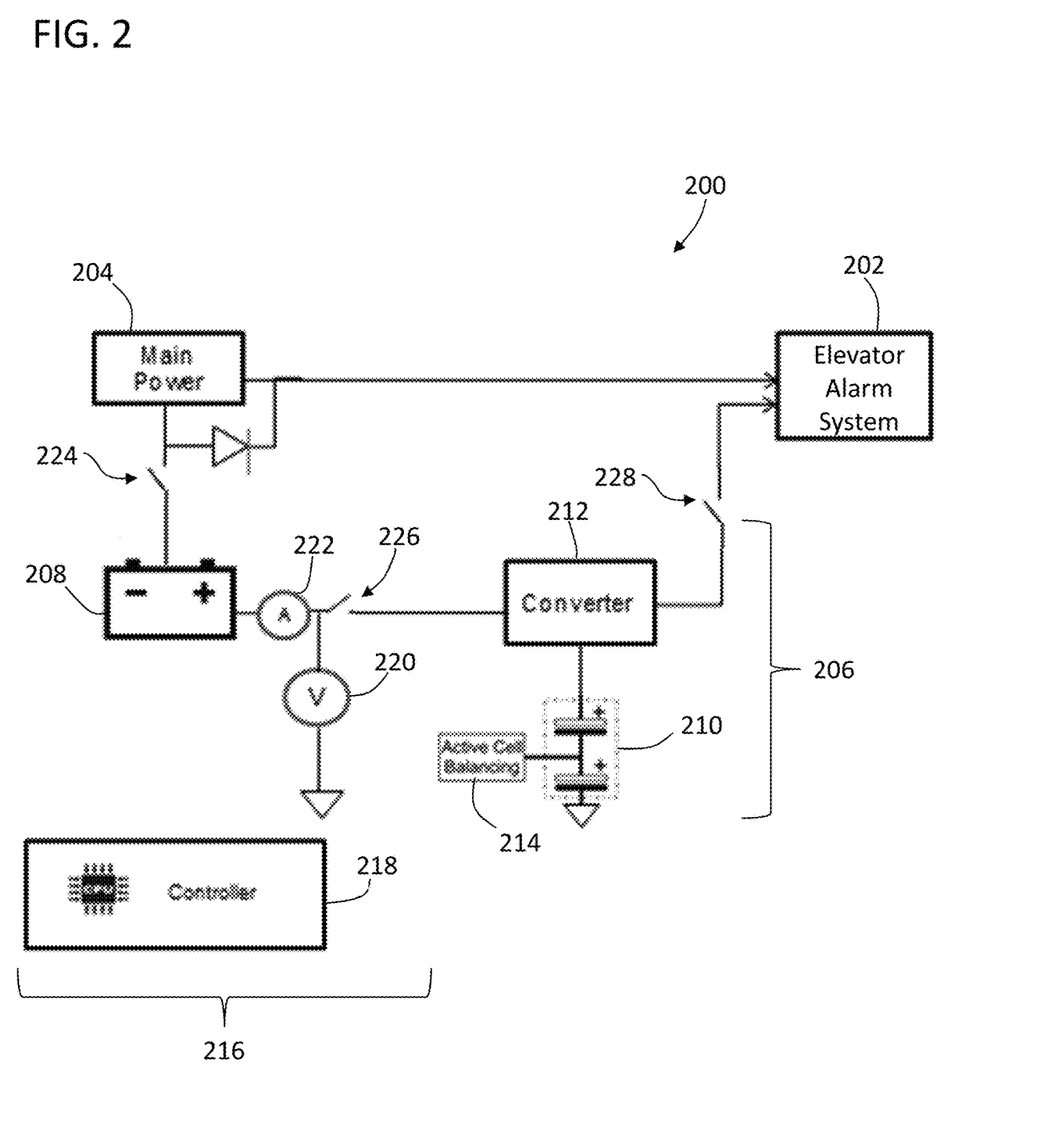
FIG. 2 is a schematic diagram of an elevator alarm electrical system for an elevator alarm system in accordance with an embodiment of the present disclosure.

Turning now to FIG. 2, a schematic illustration of an elevator alarm electrical system 200 for an elevator alarm system 202 is shown. The elevator alarm electrical system 200 may be implemented within an elevator system such as shown and described with respect to FIG. 1. The elevator alarm system 202 is configured to provide an alarm and/or notification (e.g., audio/visual) to passengers within an elevator car. The elevator alarm system 202 can provide audio into an elevator car through speakers, and may receive audio from passengers within the car through a microphone. As such, the elevator alarm system 202 can provide a communication channel between passengers within the elevator car and rescue operation personnel. Additionally, the elevator alarm system 202 can provide prerecorded information and/or sounds in the event of an emergency. In some embodiments, the elevator alarm system 202 can provide a live communication channel for passengers to actively communicate with persons outside of the elevator car (e.g., rescue personnel).

During typical operation, the elevator alarm system 202 is electrically connected to a primary power source 204 (e.g., main power, grid power, etc.). The primary power source 204 can supply continuous power to the elevator alarm system 202 at all times that the primary power source 204 is active. In the event of an emergency, the elevator alarm system 202 will receive power from the primary power source 204 to power the electrical components of the elevator alarm system 202 (e.g., speakers, microphone, lights, communication lines, etc.).

The elevator alarm electrical system 200 also includes a secondary power source 206 that is configured to provide power to the elevator alarm system 202 in the event that power cannot be supplied from the primary power source 204, e.g., if there is a power failure or power loss. The secondary power source 206 may include a first storage device 208 and a second storage device 210. As illustratively shown, the first storage device 208 is a battery and the second storage device 210 is a capacitor, although other types of power device may be employed without departing from the scope of the present disclosure. For example, in some embodiments, both the first and second storage devices 208, 210 may be batteries. In some such embodiments, the first storage device 208 may be a first type of battery and the second storage device 210 may be a second, different type of battery. In some embodiments, and as illustratively shown, a power converter 212 and/or cell balancing element 214 can be provided to ensure appropriate power supply from the secondary power source 206 to the elevator alarm system 202. The first storage device 208 may be of sufficient size and capacity to ensure a predetermined amount or duration of power may be supplied to the elevator alarm system 202 when power is supplied from the secondary power source 206.

A control system 216 may be electrically connected to parts of the elevator alarm electrical system 200. In some embodiments, the control system 216 can be configured to provide testing capability. As such, the control system 216, as shown, includes various components for testing the capacity and health of the first storage device 208. As shown, the control system 216 includes a controller 218, a voltmeter 220, and an ammeter 222, although other components and/or elements may be included in the control system 216, as will be appreciated by those of skill in the art. The controller 218 may include processors, data storage elements (e.g., memory), input/output components, communication components, etc., as will be appreciated by those of skill in the art.

The elevator alarm electrical system 200 further includes a number of switches, which are arranged to open and close based on conditions of the elevator alarm electrical system 200. A first switch 224 is located between the first storage device 208 of the secondary power source 206 and the primary power source 204. The first switch 224 also enables for connection between the first storage device 208 and the elevator alarm system 202, such that when power cannot be supplied from the primary power source 204, power can be provided to the elevator alarm system 202 from the first storage device 208. A second switch 226 is arranged between the first storage device 208 and the converter 212 and is configured to enable electrical connection between the first storage device 208 and the second storage device 210. A third switch 228 is arranged between the secondary power source 206 and the elevator alarm system 202, and enables direct electrical connection from the first and second storage devices 208, 210 to the elevator alarm system 202. The switches 224, 226, 228 may be operably controlled by the controller 218. As such, the controller 218 can selectively control the internal electrical connection of the secondary power source 206 and the connection of the secondary power source 206 to the primary power source 204 and the elevator alarm system 202.

In operation, and as described in more detail below, when the first switch 224 is closed, power can be supplied from the primary power source 204 to the first storage device 208. As such, the first storage device 208 may be charged by the primary power source 204. Further, when the first switch is closed, power can be supplied from the first storage device 208 to the elevator alarm system 202. When the second switch 226 is closed, power can flow from the first storage device 208 to the second storage device 210. When the third switch is closed, power can flow from the second storage device 210 to the elevator alarm system 202, and when the second switch 226 and the third switch 228 are closed, power can flow from both the first and second storage devices 208, 210 to the elevator alarm system 202.

Turning now to FIGS. 3A-3D, schematic diagrams of power supply for an elevator alarm electrical system 300 in accordance with an embodiment of the present disclosure are shown. The elevator alarm electrical system 300 is substantially similar to the elevator alarm electrical system 200 shown and described with respect to FIG. 2. FIGS. 3A-3D illustrate power flow within the elevator alarm electrical system 300 in different situations or circumstances. The elevator alarm electrical system 300 includes a primary power source 304 and a secondary power source 306 that are arranged to supply power to an elevator alarm system 302. The secondary power source 306 includes a first storage device 308 and a second storage device 310, as described above. A plurality of switches 324, 326, 328 are arranged as shown and described with respect to the embodiment of FIG. 2, and a converter 312 and a cell balancing element 314 are provided to ensure proper power supply from the secondary power source 306 to the elevator alarm system 302. A control system 316 includes a controller 318, a voltmeter 320, and an ammeter 322, and may be configured for testing of the first storage device 308 of the secondary power source 306. In FIGS. 3A-3D, dashed arrow lines represent a flow of electricity within the elevator alarm electrical system 300.

Figure 3A:
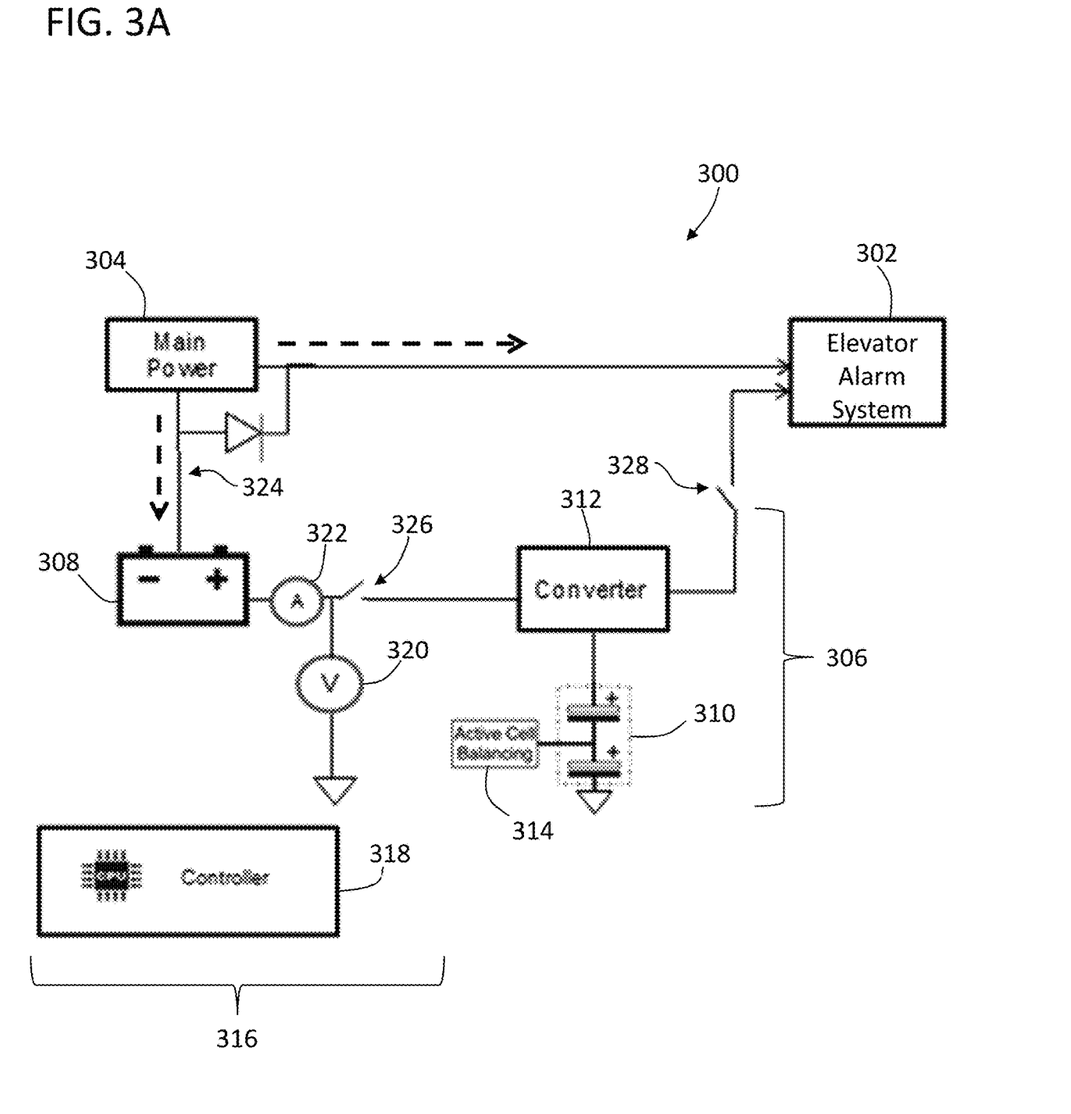
FIG. 3A is a schematic diagram of power supply for an elevator alarm electrical system in accordance with an embodiment of the present disclosure, during normal operation.

FIG. 3A is illustrative of a normal operating situation or condition. In this condition, the controller 318 has the first switch 324 closed, and the second and third switches 326, 328 are open. Power is supplied from the primary power source 304 to the elevator alarm system 302. Further, power is supplied from the primary power source 304 to the first storage device 308. The power supplied to the first storage device 308 can be used to charge or maintain a charge of the first storage device 308. The controller 318 may be configured to monitor a charge state to control the charging and electrical power supply to the first storage device 308.

Figure 3B:
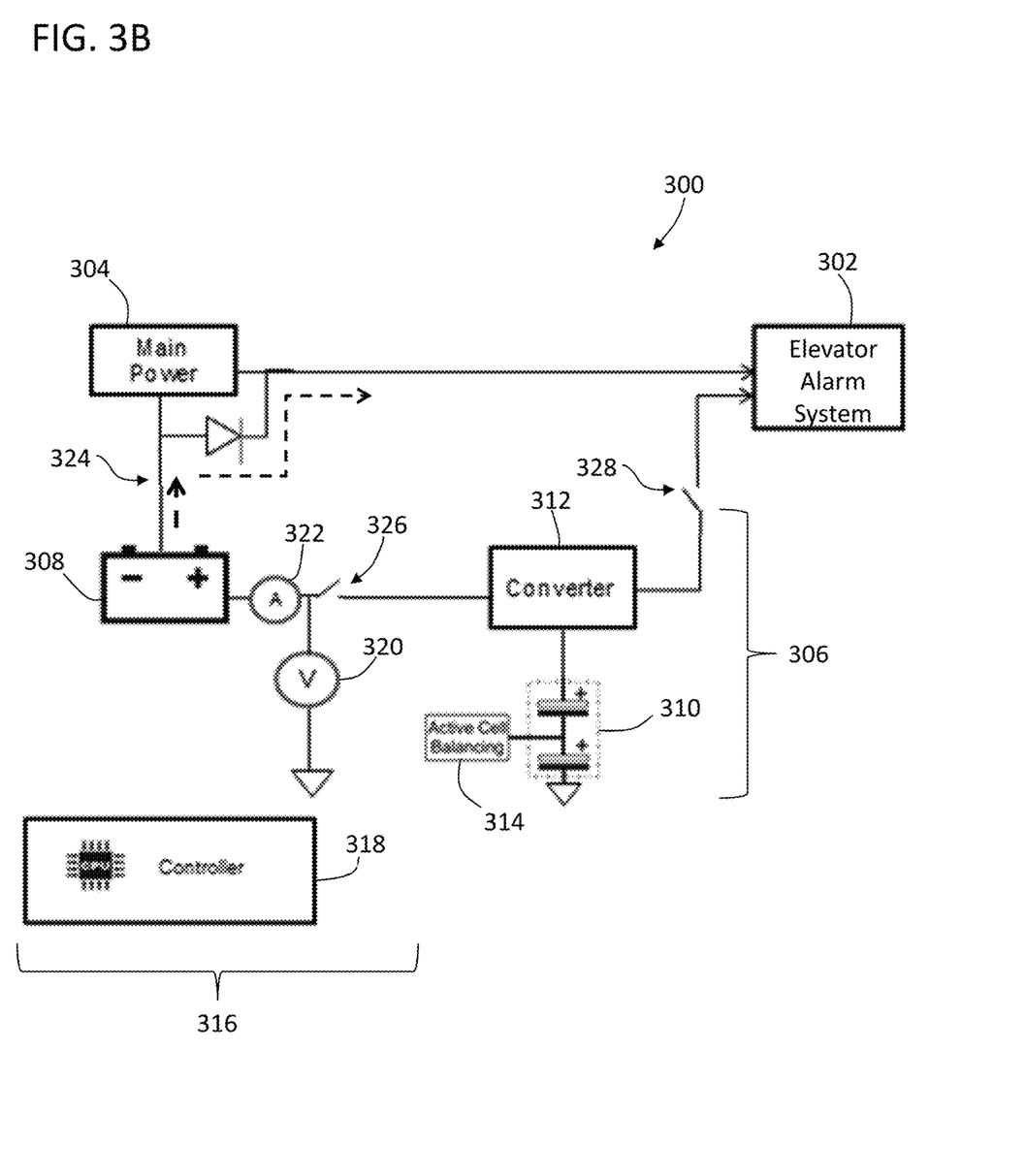
FIG. 3B is a schematic diagram of power supply for the elevator alarm electrical system of FIG. 3A, during a power failure of a primary power source.

FIG. 3B is illustrative of an operating situation or condition wherein the primary power source 304 has failed (e.g., power outage) and power is supplied to the elevator alarm system 302 from the secondary power source 306. In this condition, the controller 318 has the first switch 324 closed, and the second and third switches 326, 328 are open. Power is supplied from the first storage device 308 of the secondary power source 306 to the elevator alarm system 302. The second storage device 310 is isolated from the power circuit.

Figure 3C:
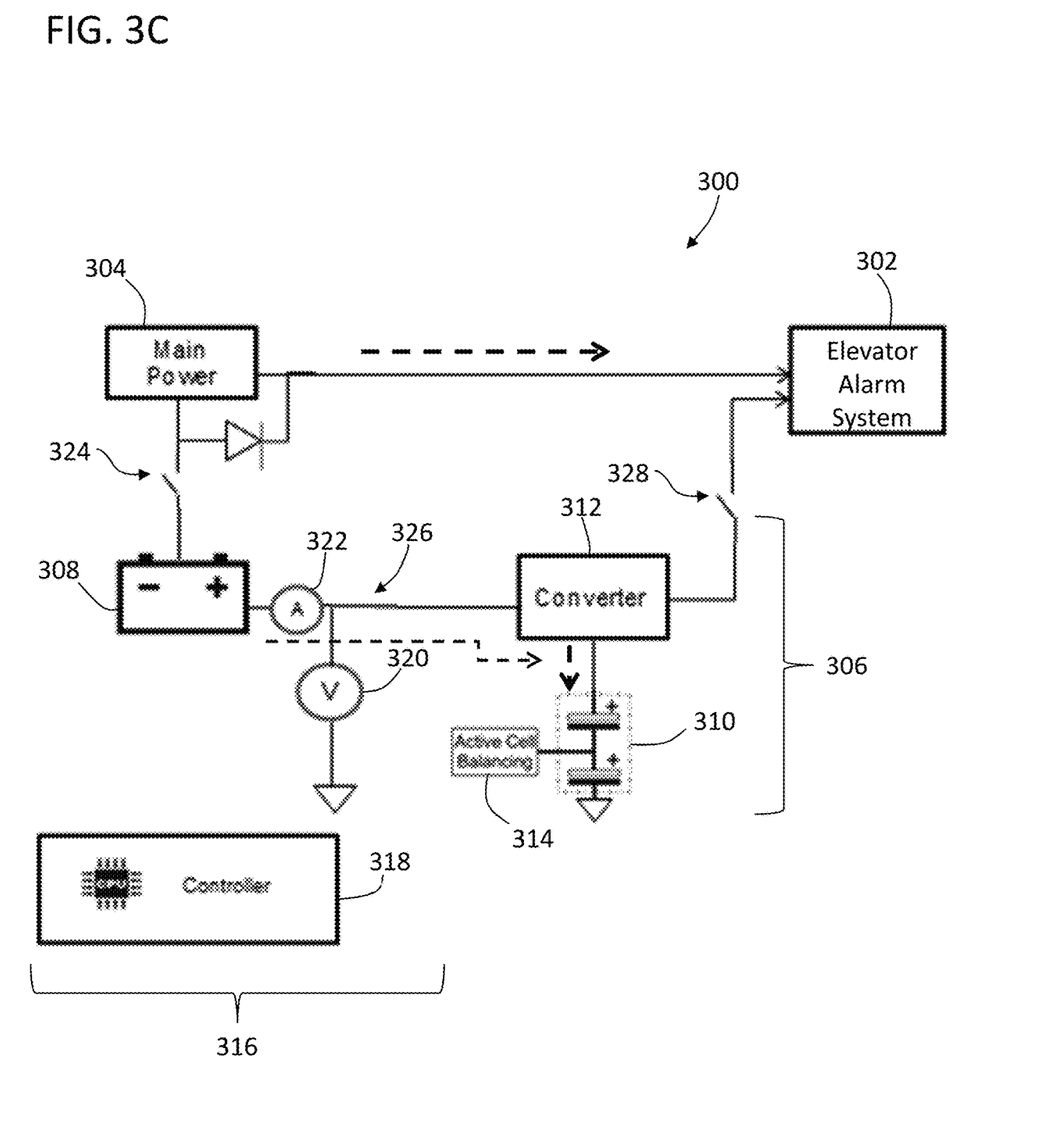
FIG. 3C is a schematic diagram of power supply for the elevator alarm electrical system of FIG. 3A, during a testing operation of a component of a secondary power source.

FIG. 3C is illustrative of a testing operation situation or condition. In this condition, the controller 318 has the first switch 324 open, the second switch 326 closed, and the third switch 328 open. As such, the secondary power source 306 is isolated from the electrical supply to the elevator alarm system 302. Power is supplied from the primary power source 304 to the elevator alarm system 302. During a testing operation, controlled by the controller 318, power is supplied from the first storage device 308 to the second storage device 310. The power supplied from the first storage device 308 to the second storage device 310 may completely deplete the charge of the first storage device 308, and, simultaneously, the power may be temporarily stored within the second storage device 310. The controller 318 may be configured to monitor the current as the electricity passes from the first storage device 308 to the second storage device 310. In this manner, the controller 318 may measure a capacity of the first storage device 308.

Further, during this discharge operation of the first storage device 308, the power is temporarily stored in the second storage device 310, thus no power is lost during the testing operation (or no substantial or appreciable amount is lost). The energy of the storage devices 308, 310 of the secondary power source remains around constant during the testing operation to comply with requirements of powering the elevator alarm system 302. Thus, even during the testing operation, the power of the secondary power source 306 is maintained as a backup power supply for the elevator alarm system 302. When the testing is complete, the power temporarily stored in the second storage device 310 can be redirected back into the first storage device 308 to recharge the first storage device 308. Subsequently, the first switch 324 may be closed to reconnect the first storage device 308 to the primary power source 304 (and the second and third switches 326, 328 may be opened—i.e., as shown in FIG. 3A).

In one non-limiting example, during the testing operation, the second storage device 310 is charged using the converter 312. The second storage device 310, such as a capacitor, supercapacitor, and/or different battery type, is used as a load for the first storage device 308 (e.g., a battery). During testing, the current and voltage are measured as the energy from the first storage device 308 goes to second storage device 310. The controller 318 will measure parameters, such as current, time, and voltage, to enable a determination of battery capacity with accuracy. When the voltage of the first storage device 308 reaches the end of discharge voltage a timer or clock stops. The capacity is the sum of current multiplied by voltage during the testing operation. For example, in one non-limiting example, the combined power maintained within the first and second storage devices 308, 310 may guarantee at least one hour of functionality of the elevator alarm system 302, including fifteen minutes of voice communication.

During the testing operation, if it is determined that the first storage device is at or below a predetermined value, a notification may be generated to indicate that maintenance should be performed. For example, if during the testing operation it is determined that the first storage device should be replaced due to a low capacity, a notification can be generated and sent to a remote location (e.g., elevator system controller, maintenance facility, remote servers, distributed computing systems, etc.). The predetermined value may be a value that is above a minimum required to supply backup power to the elevator alarm system, but may be low enough to indicate a deterioration of the first storage device. In such a manner, a minimum required power may be maintained within the secondary power source, even when the first storage device is determined to be at low capacity.

Figure 3D:
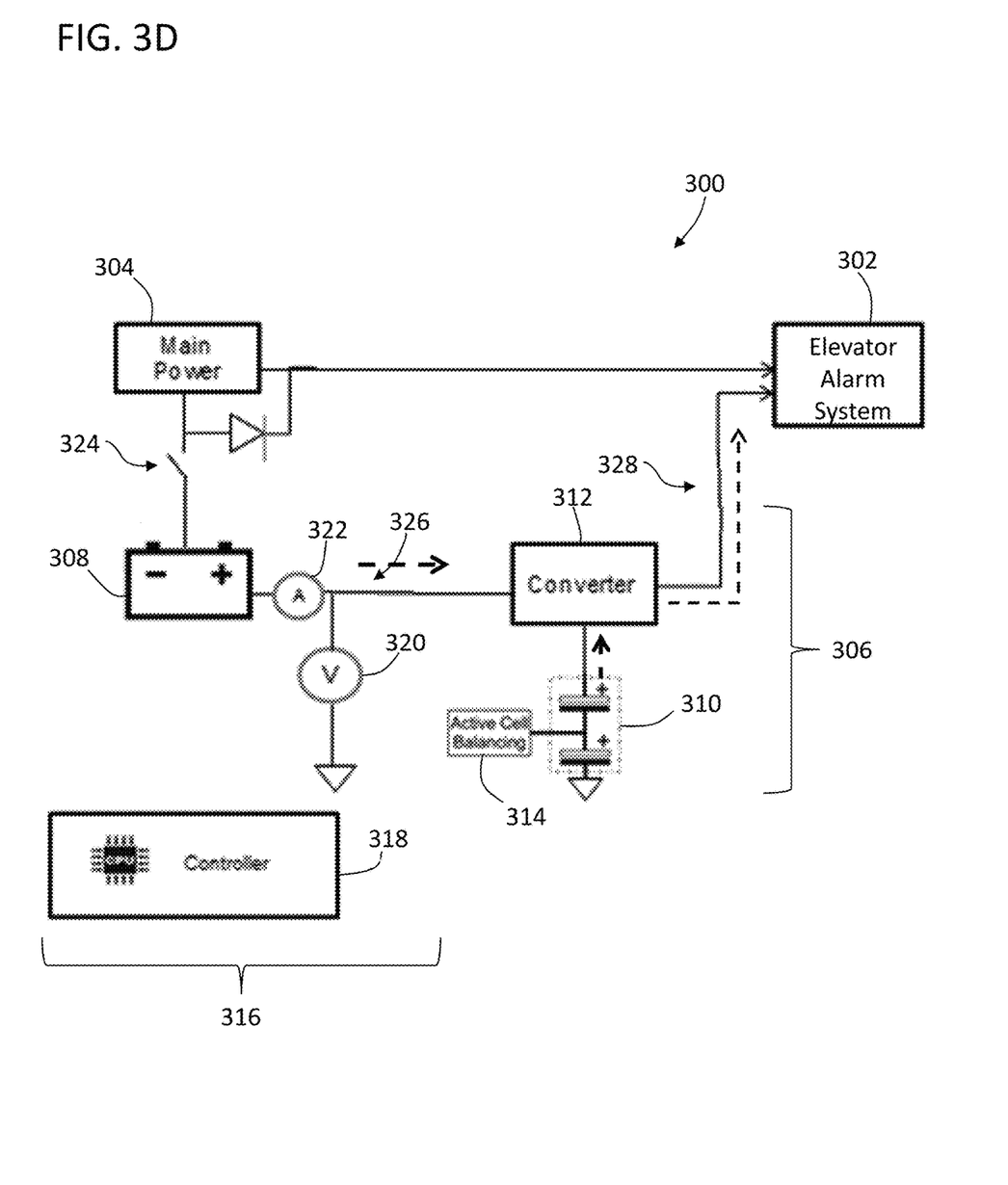
FIG. 3D is a schematic diagram of power supply for the elevator alarm electrical system of FIG. 3A, during a power failure of a primary power source and during a testing operation of a component of the secondary power source.

FIG. 3D is illustrative of an operating situation or condition wherein the primary power source 304 has failed (e.g., power outage) and power is supplied to the elevator alarm system 302 from the secondary power source 306 during a testing operation (e.g., during the situation shown in FIG. 3C). In this condition, the controller 318 has the first switch 324 open, and the second and third switches 326, 328 are closed. Power is supplied from the first storage device 308 and the second storage device 310 of the secondary power source 306 to the elevator alarm system 302, through the third switch 328. The switches 324, 326, 328 are controlled by the controller 318, with the controller 318 configured to detect a power loss or power failure from the primary power source 304. Because the power from the first storage device 308 is temporarily stored in the second storage device 310, the secondary power source 306 as a whole maintains sufficient power to provide a required amount of power to the elevator alarm system 302 in the event of a power loss or failure of the primary power source 304.

That is, in accordance with embodiments of the present disclosure, the secondary power source 306 is maintained such that the sum of power within the storage devices thereof is sufficient for supplying power to the elevator alarm system in the event of a power failure of the primary power source. Accordingly, advantageously, downtime of the elevator system for testing the backup (secondary) power source may be avoided.

Advantageously, embodiments described herein provide a battery capacity monitoring system for backup power of elevator alarm systems. Embodiments described herein allow for the measuring of battery capacity and supporting main power failure when the battery is under capacity measurement or testing. Advantageously, in some embodiments, the total energy available for supporting the elevator alarm system is loaded in a battery (e.g., first storage device) and supercapacitor (e.g., second storage device). The sum of both the first and second storage devices is able to guarantee the power requirements of the elevator alarm system, in the event of a primary power source failure. Advantageously, as noted, embodiments of the present disclosure can avoid interrupting elevator system operation. In some embodiments, the controller will control and monitor the different switches and measure the electrical value and provide capacity information to the rest of the elevator control and/or remote monitoring. Accordingly, without interruption of an elevator system, an elevator alarm system backup power may be tested. The results of the testing may be logged, stored, and/or transmitted to other elements, such as elevator controllers, remote systems (e.g., monitoring systems), to maintenance personnel, etc., thus providing an efficient mechanism for monitoring the state of the secondary power source of an elevator alarm system.

In one non-limiting example of an embodiment of the present disclosure, an electrical circuit is provided to address protection of main power interruptions by using a battery and buck-boost converter and stacked supercapacitors with active cell balancing. A battery capacity monitoring circuit is provided to test and control power from one or both of the battery and the supercapacitors. That is, the battery capacity monitoring circuit allows to support main power failure when the battery is under capacity measurement or testing. A battery capacity testing controller controls and monitors the different switches and measures the electrical value and provides capacity information to the rest of the elevator control and/or remote monitoring. In some embodiments, such as the one described here, a converter is required between the supercapacitor and the system supply-voltage because the voltage of the supercapacitor may vary. The converter supports energy transfer from the input to the output, as well as from the output to the input. In some embodiments, by charging the capacitor to a voltage level higher than the main power voltage results in a smaller backup capacitor value and smaller solution size to store the same amount of energy.

The terminology used herein is for the purpose of describing particular embodiments only and is not intended to be limiting of the present disclosure. The term "about" is intended to include the degree of error associated with measurement of the particular quantity and/or manufacturing tolerances based upon the equipment available at the time of filing the application. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. An electrical system of an elevator system comprising:
    an elevator alarm system configured to provide an alarm within an elevator car of the elevator system, wherein the elevator alarm system is configured to be supplied with power from a primary power source;
    a secondary power source having a first storage device and a second storage device; and
    a controller configured to:
        control a power flow from the secondary power source to the elevator alarm system when the primary power source fails; and
        test a capacity of the first storage device by discharging a power of the first storage device and storing said discharged power within the second storage device.

2. The electrical system of claim 1, wherein the test is performed to monitor a capacity level of the first storage device and compare such capacity to a predetermined value.

3. The electrical system of claim 2, wherein when the monitored capacity level of the first storage device is below the predetermined value, the controller is configured to generate a notification for maintenance.

4. The electrical system of claim 1, wherein the first storage device is a battery.

5. The electrical system of claim 1, wherein the second storage device is a capacitor.

6. The electrical system of claim 5, further comprising a cell balancing element operably connected to the capacitor.

7. The electrical system of claim 1, wherein the second storage device is a battery.

8. The electrical system of claim 1, wherein a first switch is located between the primary power source and the first storage device, a second switch is located between the first storage device and the second storage device, and a third switch is located between the second storage device and the elevator alarm system.

9. The electrical system of claim 8, wherein the controller is configured to control operation of the first switch, the second switch, and the third switch.

10. The electrical system of claim 1, further comprising a control system, the control system including the controller, a voltmeter, and an ammeter.

11. The electrical system of claim 1, further comprising a converter arranged between the second storage device and the elevator alarm system.

12. The electrical system of claim 11, wherein the converter is located between the second storage device and the first storage device.

13. The electrical system of claim 1, wherein the primary power source is grid power.

14. A method for testing a secondary power source of an elevator alarm system, the secondary power source comprising a first storage device and a second storage device, the method comprising:
    isolating the secondary power source;
    discharging a power from the first storage device to the second storage device;
    monitoring a current and a voltage of the discharged power;
    storing the discharged power in the second storage device;
    determining a charge of the first storage device based on the monitored current and voltage;
    comparing the determined charge against a predetermined value; and
    generating a notification when the determined charge is less than or equal to the predetermined value.

15. The method of claim 14, further comprising:
    detecting a power failure of a primary power source;
    connecting the secondary power source to the elevator alarm system; and
    supplying power from at least one of the first storage device and the second storage device to the elevator alarm system during the power failure.

16. The method of claim 15, wherein the primary power source is grid power.

17. The method of claim 14, further comprising:
    monitor a capacity level of the first storage device; and
    comparing such capacity to a predetermined value.

18. The method of claim 14, wherein the first storage device is a battery.

19. The method of claim 14, wherein the second storage device is a capacitor.

20. The method of claim 14, wherein the second storage device is a battery.

* * * * *